United States Patent [19]

Keller

[11] Patent Number: 4,654,580
[45] Date of Patent: Mar. 31, 1987

[54] ELECTRICAL CONTINUITY TESTER FOR THE CONNECTION OF A TERMINAL AND AN INSULATED LEAD

[75] Inventor: Joseph R. Keller, Harrisburg, Pa.

[73] Assignee: AMP Incorporated, Harrisburg, Pa.

[21] Appl. No.: 621,631

[22] Filed: Jun. 18, 1984

[51] Int. Cl.⁴ .................. G01R 31/02; B23P 21/00
[52] U.S. Cl. ................... 324/51; 324/61 R; 324/DIG. 1; 29/705
[58] Field of Search .............. 324/51, 52, 54, 57 R, 324/61 R, DIG. 1, 60 R, 60 C, 98, 101; 340/649, 650, 652; 29/749, 705, 593

[56] References Cited

U.S. PATENT DOCUMENTS

| | | | |
|---|---|---|---|
| 3,275,933 | 9/1966 | Dranetz | 324/57 |
| 3,757,211 | 9/1973 | Goto | 324/61 R |
| 3,829,850 | 8/1974 | Guetersloh | 324/61 R X |
| 3,879,660 | 4/1975 | Piso | 324/61 R |
| 4,110,880 | 9/1978 | Peppler et al. | 324/51 X |
| 4,157,541 | 6/1979 | Harwell | 324/54 |
| 4,159,158 | 6/1979 | Weilder | 339/217 S X |
| 4,173,736 | 11/1979 | Adams | 324/51 |
| 4,187,504 | 2/1980 | Cantrell | 324/51 |

Primary Examiner—Reinhard J. Eisenzopf
Assistant Examiner—Jack B. Harvey
Attorney, Agent, or Firm—Thomas G. Terrell

[57] ABSTRACT

Electrical continuity between an electrical terminal and a metal core of an insulated electrical lead is tested for, by supplying substantially identical oscillatory signals to the arms of a two-arm bridge circuit, the arms of which are connected to respective inlets of a differential amplifier, the arms being grounded through capacitances and a ground plane existing in the vicinity of the lead. If there is electrical continuity between the terminal and said core, the capacitance between the core and the ground plane causes imbalance between the signal inputs that are applied by the bridge circuit to the differential amplifier to cause it to emit a continuity success signal.

4 Claims, 7 Drawing Figures

ELECTRICAL CONTINUITY TESTER FOR THE CONNECTION OF A TERMINAL AND AN INSULATED LEAD

This invention relates to a method of testing for electrical continuity between an electrical terminal and a metal core of an insulated lead and to means for testing for such continuity.

Where an electrical terminal is to be connected to one end only, of an insulated lead, it has hitherto been necessary to make a galvanic connection to the metal core of the lead at a position back from the terminal. Where the testing means was so positioned, that it was inconvenient for a test probe to be applied to the other end of the lead, the test probe needed to be driven through the insulation of the lead, with consequence damage to the insulation, as well as the risk of the connection between the test probe and the core being defective.

The present invention proceeds from the realization that there will normally exist in the vicinity of the lead, a ground plane, being for example the apparatus itself or its operator, or both, that a capacitance will exist between the lead and the ground plane and that the presence of such a capacitance can be tested for at the terminal to determine whether the connection between the core and the terminal is electrically continuous.

According to one aspect of the invention, in a method of testing for electrical continuity between an electrical terminal and a metal core of an insulated lead, identical oscillatory signals are delivered simultaneously to the terminal and to arms of a bridge circuit coupled to signal comparison means responsive to signal imbalance in the arms, the arms of the bridge circuit being grounded and there being a ground plane in the vicinity of the lead; whereby if there is electrical continuity between the terminal and the core, the capacitance present between the core and the ground plane causes imbalance between the signals in the bridge arms so that unbalanced signal inputs are applied by the bridge circuit to the signal comparison means to cause the latter to emit a signal which is indicative of said electrical continuity.

According to another aspect of the invention, means are provided in apparatus for electrically connecting an insulated lead to an electrical terminal, for testing for electrical continuity between a metal core of the lead and the terminal, said test means comprising an electrical test probe, means for engaging the test probe with the terminal when the latter has been connected to the lead by means of the apparatus, ground plane means in the vicinity of the lead, an oscillatory circuit, a bridge circuit, signal comparison means responsive to unbalanced inputs from the bridge circuit, and continuity indicating means, the oscillatory circuit having an outlet connected to inlets of the bridge circuit and thereby to the probe, outlets of the bridge circuit being connected to respective inlets of the comparison means an outlet of which is connected to the continuity indicating means; whereby the bridge circuit receives substantially identical signals from the oscillatory circuit, and is also energized thereby through capacitance present between the core and the ground plane means when there is electrical continuity between the core and the terminal, so that the bridge circuit applies unbalanced inputs to the signal comparison means to cause it to activate the continuity indicating means.

Preferably, the signal comparison means, which may be a differential amplifier, is connected to the continuity indicating means, by way of an active filter, an amplifier, a signal level detector, and an opto oscillator. The bridge circuit is preferably grounded through a variable capacitor.

Where the electrical continuity between a plurality of terminals of a multi contact electrical connector, and the cores of respective individual leads is to be tested, a test probe connected to a bridge circuit and signal comparison means may be provided for each terminal, the oscillatory circuit and the continuity indicating means being common. Alternatively, the test probes may be scanned by a multiplexer, there being a single bridge circuit, and signal comparison means, common to all the terminals.

The oscillatory circuit may produce a continuous sinusoidal voltage, for example of about 100 KHz at 10 volts peak, for minimizing interference with other apparatus.

If there is discontinuity in the termination being tested, the capacitance present between the terminal and the ground plane will be minimal, so that the bridge circuit will deliver plane inputs to the signal comparison means, but if there is electrical continuity between the terminal and the lead, one of the signals delivered to the comparison means will be amplitude and phase changed so that differential voltages will be present on the arms of the bridge so that the differential amplifier energizes the continuity indicating means.

According to another aspect of the invention, means for testing for electrical continuity between a metal core of an insulated lead and an electrical terminal, comprises a test probe, an oscillatory circuit, a two-arm bridge circuit, a differential amplifier, and continuity indicating means, the oscillatory circuit having an outlet connected to the test probe and to both arms of the bridge circuit, each arm of the bridge circuit being connected to an individual inlet of the differential amplifier, and the differential amplifier having an outlet connected to the indicating means, each arm of the bridge circuit being grounded and the differential amplifier being sensitive to the application of unbalanced inputs to the inlets thereof so as to activate said indicating means.

Although it is known from U.S. Pat. Nos. 4,418,250, and 4,241,304 to employ an oscillatory signal to measure the capacitance of a wire, neither of these references discloses means for testing the continuity of a connection between a terminal and a wire.

For a better understanding of the present invention, and to show how it may be carried into effect, reference will now be made by way of example of the accompanying drawings in which;

DESCRIPTION OF THE PREFERRED EMBODIMENT

Figure 1:
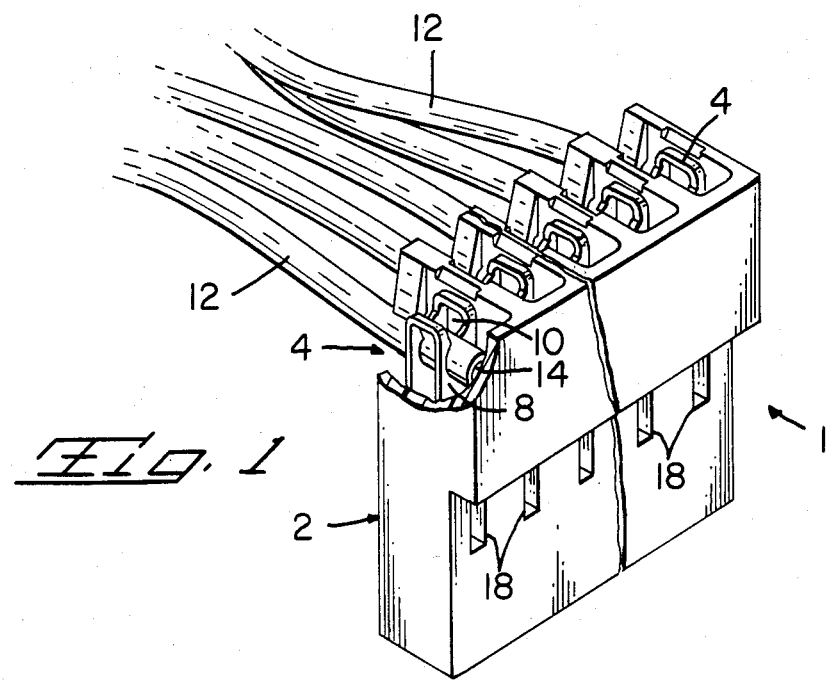
FIG. 1 is a perspective view of a multi-contact electrical connector to terminals of which insulated leads have been connected.
Figure 2:
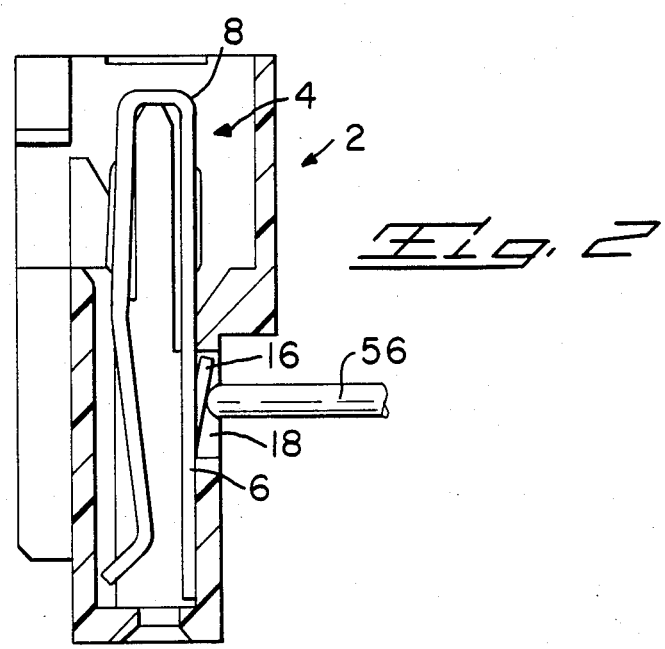
FIG. 2 is a cross-sectional view of the connector showing an electrical test probe in contact with one of the terminals of the connector, the leads not being shown.

The connector 1 shown in FIGS. 1 and 2, comprises an insulating housing 2 containing twelve electrical terminals 4, only a few of which are shown. Each terminal comprises a receptacle portion 6 and a wire connecting portion 8 having a wire slot 10 into which an insulated electrical lead 12 has been forced so that the edges of the slot 10 make a firm electrically conductive contact with the metal core 14 of the lead 12. As shown in FIG. 2, the terminals 8 are retained in the housing 2 by means of locking tangs 16 on the terminals 4, which project into windows 18 in the housing 2. Such a connector is described in detail in U.S. Pat. No. 4,159,158, which is incorporated by reference herein.

Figure 5:
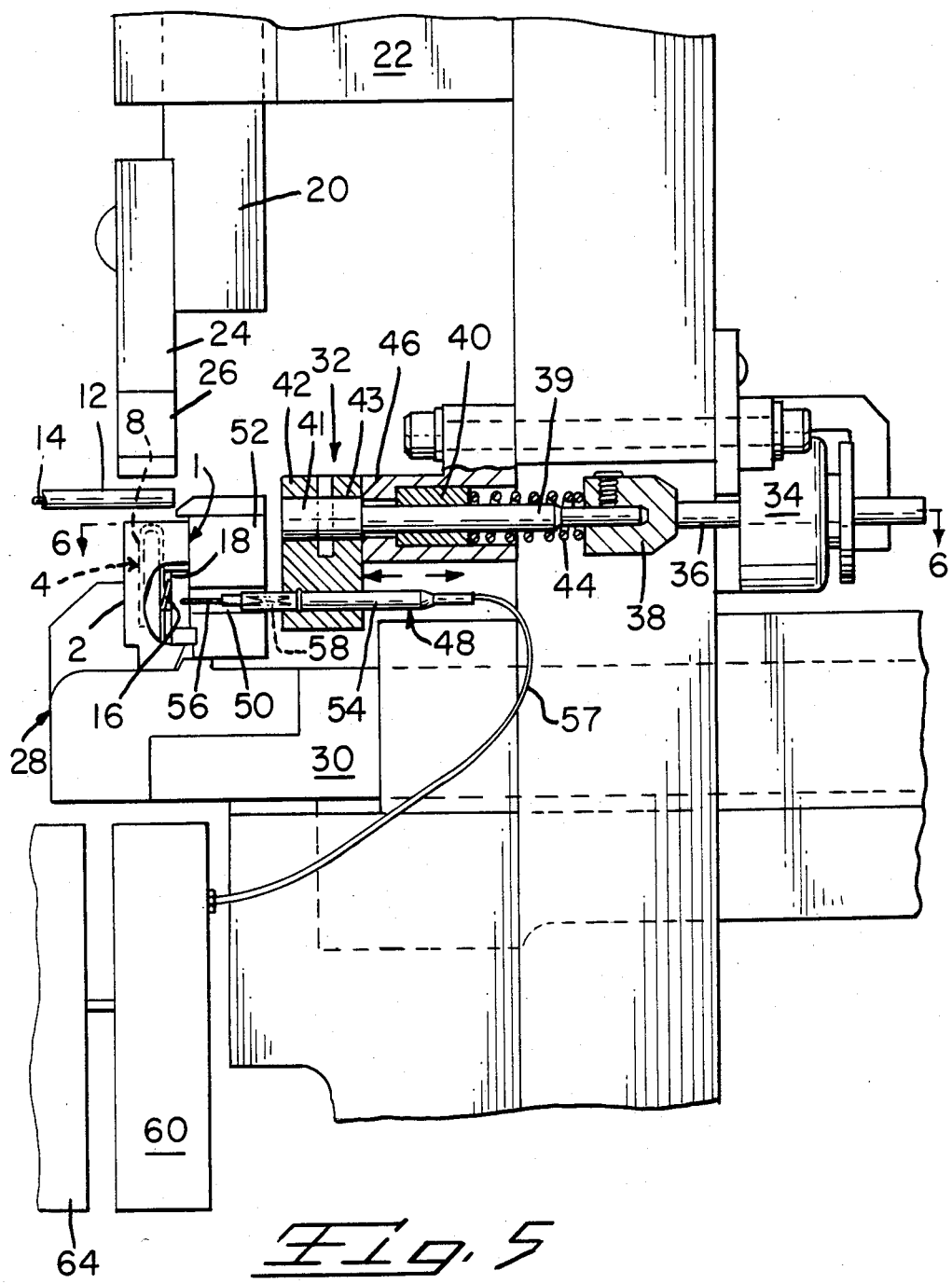
FIG. 5 is a diagrammatic side view, shown partly in a section, of apparatus for electrically connecting insulated leads to the terminals of the connector of FIGS. 1 and 2 and being provided with continuity testing means according to FIGS. 3 and 4.
Figure 6:
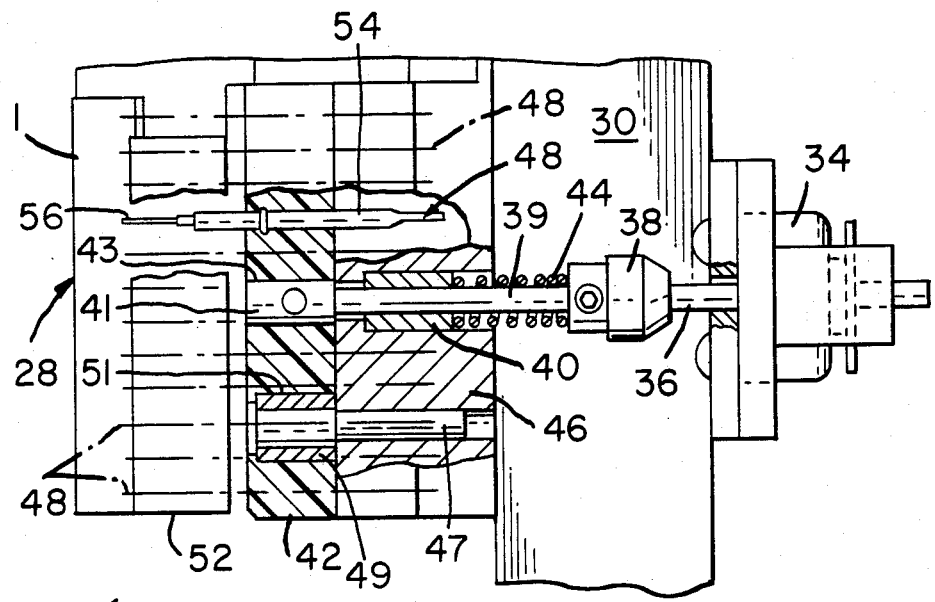
FIG. 6 is view taken on the lines 6—6 of FIG. 5.
Figure 7:
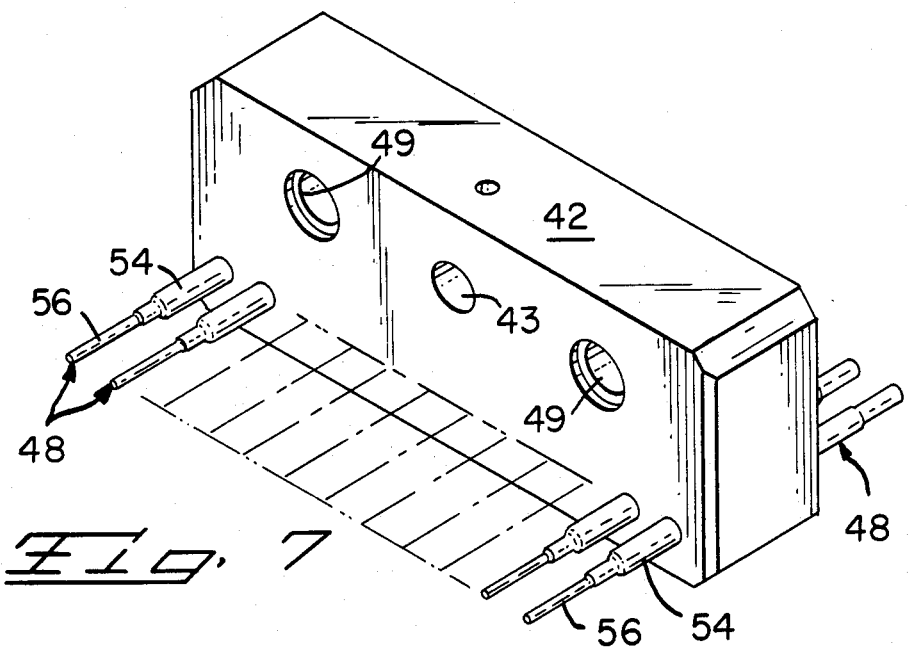
FIG. 7 is a perspective view of a detail of FIGS. 5 and 6.

The apparatus shown in FIGS. 5 and 6 comprises a press ram 20 arranged to be driven in vertical reciprocating motion by means of a drive motor, not shown, and being slideably mounted in a press frame 22. On the ram 20 is a wire insertion tool 24 having twelve wire insertion fingers 26 spaced from one another longitudinally of a connector holder 28 on an applicator base 30. The ram 20 is arranged to be driven by the motor through a working stroke so that each finger 26 inserts a respective insulated lead 12 into the wire slot of a corresponding terminal 4 of a connector 1 on the connector holder 28, upon a start button (not shown) being actuated by the operator. Mounted on the base 30, is a test probe assembly 32 comprising a solenoid 34 fixed to the base 30 and the armature 36 of which is connected by means of an adapter 38 to a plunger 39 slideable in a bush 40 and being fixed at its end 41 remote from the adapter 38, in a bore 43 in a test probe carrier block 42, (best seen in FIG. 7), a spring 44 acting between the adapter 38 and the bush 40 to urge the plunger 39 in a rightward (as seen in FIG. 5) sense, so that the block 42 normally abuts a block 46 fixed to the base 30 and in which the bush 40 is secured against movement relative to the block 46. The block 42 is guided relative to the block 46 on rods 47 received in bushes 49 in bores 51 in the block 42 (FIG. 6). Twelve test probe units 48 extend through the lower (as seen in FIG. 5) part of the block 42 is fixed relationship thereto, each unit 48 projecting into a bore 50 in a connector guide block 52 fixed relative to the connector support 28, the bores 50 being so arranged that each is positioned opposite to a respective window 18 in the housing 2 of the connector 1 when it is operatively positioned upon the connector support 28. Each test probe unit 48 comprises a metal shielding tube 54 connected to the shield of a coaxial cable 57, and a test probe 56 coaxial with the tube 54 and being insulated therefrom. The probe 56 is connected to the central conductor of the cable 56 and is slideable axially of the tube 54, being moveable thereinto against the action of a spring 58. When the fingers 26 have inserted the leads 12 into the wire slots of the terminals 8, and the ram 20 has been moved through its subsequent return stroke, the solenoid 34 advances its armature 36, under the control of a press conrol microprocessor (not shown) so that the block 32 is advanced towards the block 52 against the action of the spring 44, whereby each probe 56 is moved axially into the corresponding window 18 in the connector housing 2, so as to engage the tang 16 therein and thus to make electrical contact with the corresponding terminal 8, thereby to test the continuity of the electrical connection between such terminal 8 and the core 14 of the corresponding lead 12, through the agency of a continuity testing unit 60 to which the cables 57 are connected and which is described in detail below, the unit 60 being connected to a microproessor 64. If there is electrical continuity between all the terminals, the microprocessor 64 is actuated to allow the connecting apparatus to remain in an active condition, but if there is no continuity between at least one of the terminals and the corresponding core, the microprocessor automatically deactivates the apparatus and displays the fault.

Figure 3:
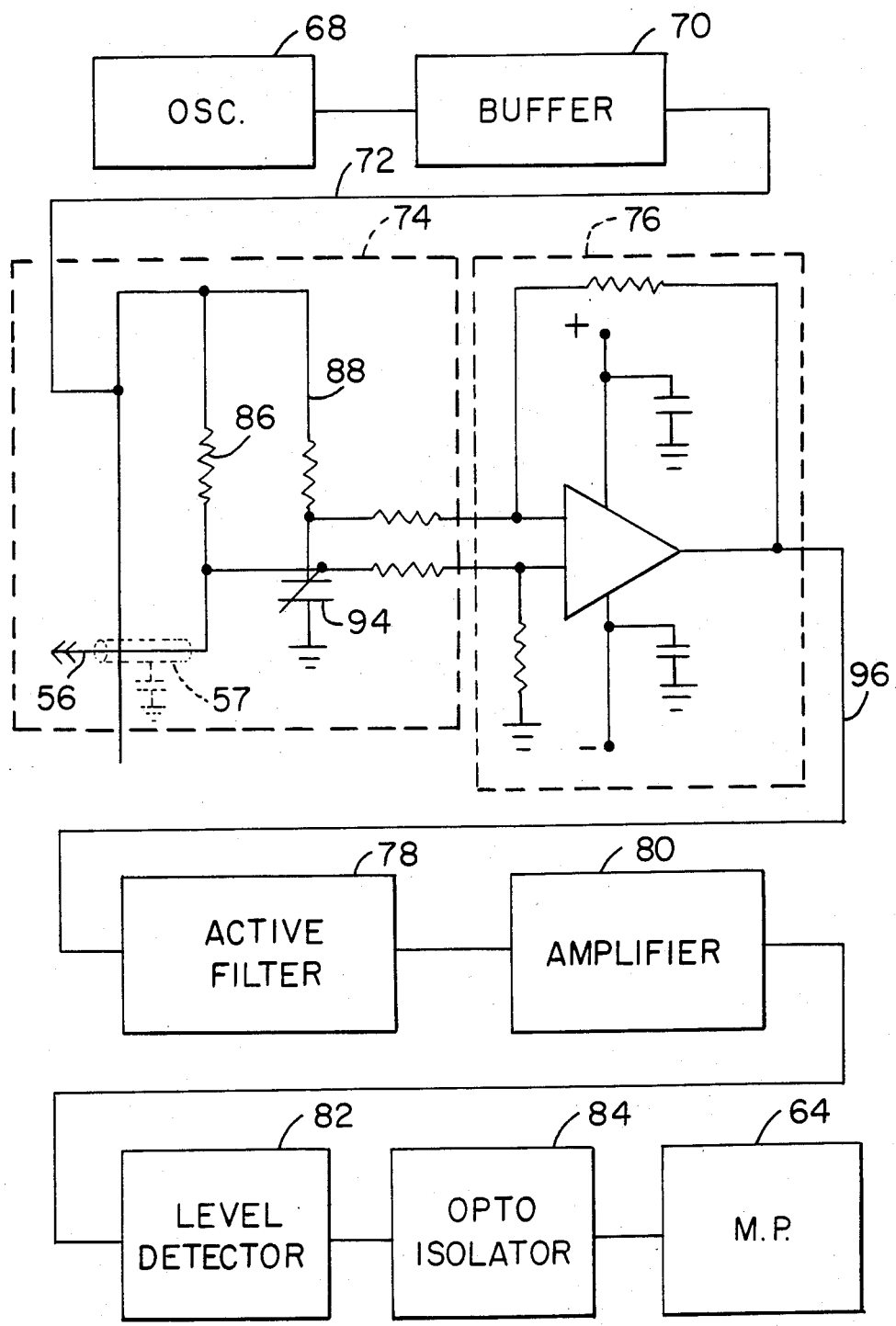
FIG. 3 is a circuit diagram, partly in block schematic form, of means for testing for electrical continuity between an electrical terminal and a metal core of an insulated lead.
Figure 4:
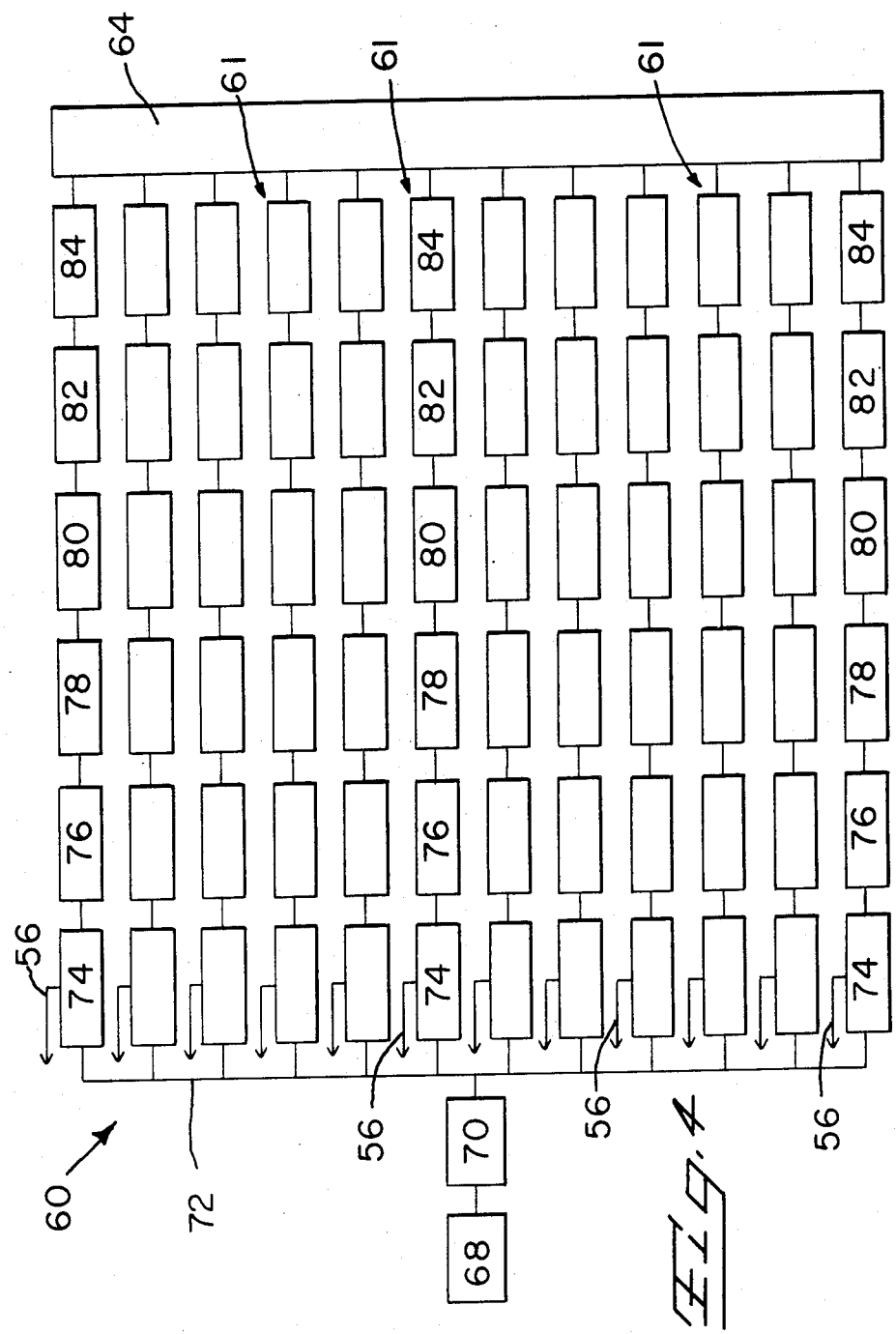
FIG. 4 is a block schematic diagram of means for testing for electrical continuity between the terminals and the metal cores of the leads of a multi-contact electrical connector.

The unit 60 comprises, as shown in FIG. 4, an oscillatory circuit 68, connected through a buffer 70 to a line 72 through which twelve identical continuity test of branches 61 are connected in parallel, each branch 61 being connected to one of the probes 56 and comprising a bridge circuit 74, a differential amplifier 76, an active filter 78, an amplifier 80, a signal level detector 82, and an opto oscillator 84, the latter being connected to the microprocessor 64 as shown in FIG. 3, each bridge circuit 74 comprises arms 86 and 88 connected to the line 72, the arm 88 being grouned through a variable trimming capacitor 94, a test probe 56 being connected to the arm 86, and thus to the line 72, via the cable 57. The arrangement of the circuit 74 is such that the circuit 68 applies oscillatory signals of substantially identical form and value to the arms 86 and 88. The arm 86 is grounded through the shield of the cable 57. The arms 86 and 88 are connected to respective inlets of the differential amplifier 76 which is responsive to unbalanced input signals in the arms 86 and 88 to energize its outlet line 96 and thus to emit a continuity success signal to the microprocessor by way of the filter 78, amplifier 80, level detector 82 and opto isolator 84.

The oscillator 68, produces a continuous sinusoidal voltage at a frequency of 100 KHz at 10 volts, peak, which is delivered to the line 72 via the buffer 70. When the test probe 56 has been applied to the tang 16 of the corresponding terminal 8 when the ram 20 has completed its working stroke; and there is electrical continuity between the core 14 of the lead 12 and the terminal 8, a capacitance exists between the test probe 56 and ground, one plate of such capacitance being constituted by the core 14 which will in practice be at least a foot in length, and the terminal 8, and the other plate of such capacitance being constituted by the natural ground plane provided by the metal of the connecting apparatus, or by the operator or by both. An additional ground plane may be provided if required. By virtue of said capacitance, the oscillatory signal produced by the oscillator and which is in balance in the arms 86 and 88, is applied via ground, to the arm 88 so that the oscillatory signal is changed in phase, and amplitude. The signals in the arms 86 and 88 are thereby unbalanced, so that upon their being compared by the differential amplifier 76, the latter energizes its outlet lead 76 so as to produce said success signal, which causes the microprocessor 64 to allow the apparatus to remain active.

In the event that there is electrical discontinuity between the core 14 and the terminal 8, minimal capacitance exists between the test probe 56 and ground, so that the voltage in the arm 88 is undisturbed, whereby the signals applied to the differential amplifier 76 remain in balance so that its outlet line 96 remains unenergized and so that the microprocessor automatically deactivates the connecting apparatus and thereby indicates said discontinuity.

The signal level detector establishes a signal amplitude threshold which must be exceeded before a signal is applied to the microprocessor 64. The variable capacitor 94 is employed to balance the capacitance of the coaxial cable 57.

The microprocessor 64 may be arranged to look at the lead only, as opposed to the lead and the terminal.

Instead of providing a continuity testing line 74, 76, 78, 80, 82, 84, for each terminal of the connector 1, a single such line maybe provided, a multiplexer (not shown) being employed to scan the test probes 56 sequentially.

I claim:

1. Apparatus for electrically connecting insulated leads to electrical terminals of an electrical connector, the apparatus comprising;

a press frame;

an electrical connector support on the frame;

a press ram slidably mounted in the press frame for vertical reciprocating motion through a working stroke towards the connector support to connect electrical leads to the terminals of an electrical connector on the connector support and through a return stroke away from the connector support;

a plunger mounted on the frame for horizontal movement towards and away from the connector support;

a plurality of electrical test probes mounted in horizontal spaced relationship in a test probe carrier on the plunger;

means for driving the plunger through a working stroke towards the connector support to apply each test probe to a terminal of the connector and for driving the plunger through a return stroke away from the connector support;

electrical continuity test means including an oscillatory circuit, a bridge circuit, signal comparison means responsive to unbalanced inputs from the bridge circuit, and continuity indicating means, the oscillatory circuit having an outlet connected to inlets of the bridge circuit, outlets of the bridge circuit being connected to respective inlets of the signal comparison means an outlet of which is connected to the continuity indicating means; and means for connecting the bridge circuit to each probe, whereby the bridge circuit receives substantially identical signals from the oscillatory circuit, and is also energized thereby through capacitance present between the leads and the frame when there is electrical continuity between a lead and a terminal and a test probe has been applied thereto, so that the bridge circuit applies unbalanced inputs to the signal comparison means, to cause it to activate the continuity indicating means.

2. Apparatus according to claim 1, in which each test probe is slidably mounted in a metal shielding tube connected to a shield of a coaxial cable by which the test probe is connected to the bridge circuit and is slideable inwardly of the tube against the action of resilient means.

3. Apparatus according to claim 1, in which said driving means is in the form of a solenoid fixed to said frame, a spring acting between a stop on the plunger and a bushing on the frame to drive said plunger through its return stroke.

4. Apparatus according to claim 1, in which the plunger is driven through its working stroke when the ram has been driven through a working and a return stroke.

* * * * *